(12) United States Patent
Chehade et al.

(10) Patent No.: US 12,513,847 B2
(45) Date of Patent: Dec. 30, 2025

(54) RACK COLUMN ASSEMBLY FOR A DATA CENTER AND METHOD FOR ASSEMBLY THEREOF

(71) Applicant: OVH, Roubaix (FR)

(72) Inventors: Ali Chehade, Moncheaux (FR); Alexandre Alain Jean-Pierre Meneboo, Harnes (FR); Gregory Francis Louis Bauchart, Wattrelos (FR); Henryk Klaba, Roubaix (FR); Valentin Cartigny, Mons-en-Baroeul (FR)

(73) Assignee: OVH, Roubaix (FR)

( * ) Notice: Subject to any disclaimer, the term of this patent is extended or adjusted under 35 U.S.C. 154(b) by 240 days.

(21) Appl. No.: 18/236,227

(22) Filed: Aug. 21, 2023

(65) Prior Publication Data

US 2024/0074082 A1 Feb. 29, 2024

(30) Foreign Application Priority Data

Aug. 25, 2022 (EP) .................................... 22306266

(51) Int. Cl.
*H05K 7/14* (2006.01)

(52) U.S. Cl.
CPC ......... *H05K 7/1489* (2013.01); *H05K 7/1492* (2013.01); *H05K 7/1497* (2013.01)

(58) Field of Classification Search
CPC .. H05K 7/1489; H05K 7/1492; H05K 7/1497; H05K 7/18; H05K 7/1488
See application file for complete search history.

(56) References Cited

U.S. PATENT DOCUMENTS 9,345,166 B2 * 5/2016 Rubenstein .......... H05K 7/1489
10,863,646 B1 12/2020 Rampey et al.

FOREIGN PATENT DOCUMENTS

CN 216208499 U 4/2022
EP 3962252 A1 3/2022

OTHER PUBLICATIONS

European Search Repoirt with regard to the EP Patent Application No. 22306266.2 completed Feb. 1, 2023.
English Abstract for CN216208499 retrieved on Espacenet on Aug. 21, 2023.

* cited by examiner

*Primary Examiner* — Jerry Wu
*Assistant Examiner* — Hung Q Dang
(74) *Attorney, Agent, or Firm* — BCF LLP

(57) ABSTRACT

A method for assembling a rack column assembly comprising: positioning a first data center rack on a support surface; stacking a second data center rack atop the first data center rack; placing a first vertical column on a first lateral side of the data center racks; after said stacking, placing a second vertical column on a second lateral side of the data center racks; connecting the first vertical column to the data center racks by fastening first lateral side attachment brackets to the data center racks; and connecting the second vertical column to the data center racks by fastening second lateral side attachment brackets to the data center racks, the first lateral side attachment brackets and the second lateral side attachment brackets limiting movement of the data center racks in a depth direction of the rack column assembly. A rack column assembly is also disclosed.

4 Claims, 11 Drawing Sheets

RACK COLUMN ASSEMBLY FOR A DATA CENTER AND METHOD FOR ASSEMBLY THEREOF

CROSS REFERENCE

The present application claims priority to EP Application No. 22306266.2, filed Aug. 25, 2022 entitled "RACK COLUMN ASSEMBLY FOR A DATA CENTER AND METHOD FOR ASSEMBLY THEREOF", the entirety of which is incorporated herein by reference.

FIELD OF TECHNOLOGY

The present technology relates to rack column assemblies for data centers and methods for their assembly.

BACKGROUND

Data centers incorporate various racks which can support different types of equipment such as computing equipment (e.g., servers), network equipment, power equipment and/or cooling equipment. In some cases, these racks can be supported by a frame or a rack-supporting structure, particularly when the racks are to be positioned above one another.

However, during use, the racks can be subjected to vibrations which can affect their stability, particularly when the racks are stacked one above the other to form rack columns. For instance, in some cases, such vibrations may be generated by seismic activity at the location of the data center, or by the movement of heavy equipment in the data center. Some existing designs attempt to solve this issue by providing dampers along the bases of the racks but such solutions are generally overly complex and expensive to implement.

There is therefore a desire for a rack column assembly that can alleviate at least some of these drawbacks.

SUMMARY

It is an object of the present technology to ameliorate at least some of the inconveniences present in the prior art.

According to one aspect of the present technology, there is provided a method for assembling a rack column assembly in a data center, the method comprising: positioning a first data center rack on a support surface; stacking a second data center rack atop the first data center rack such that the first data center rack supports the second data center rack; placing a first vertical column on a first lateral side of the first and second data center racks; after said stacking of the second data center rack atop the first data center rack, placing a second vertical column on a second lateral side of the first and second data center racks such that the first and second data center racks are disposed, in a lateral direction of the rack column assembly, between the first and second vertical columns; connecting the first vertical column to the first and second data center racks by fastening first lateral side attachment brackets to the first and second data center racks, the first lateral side attachment brackets being connected to the first vertical column and extending from the first vertical column towards the second vertical column; and connecting the second vertical column to the first and second data center racks by fastening second lateral side attachment brackets to the first and second data center racks, the second lateral side attachment brackets being connected to the second vertical column and extending from the second vertical column towards the first vertical column, the first lateral side attachment brackets and the second lateral side attachment brackets limiting movement of the first and second data center racks in a depth direction of the rack column assembly, the depth direction of the rack column assembly being normal to the lateral direction.

In some embodiments, the method further comprises connecting the first vertical column and the second vertical column to the support surface.

In some embodiments, the method further comprises connecting guiding means to an upper surface of the first data center rack; and during stacking of the second data center rack atop the first data center rack, a position of the second data center rack relative to the first data center rack is guided by the guiding means.

In some embodiments, the guiding means is configured to guide a position of the second data center rack relative to the first data center rack along the depth direction of the rack column assembly.

In some embodiments, placing the first vertical column comprises abutting the first vertical column against respective first lateral ends of the first and second data center racks; and placing the second vertical column comprises abutting the second vertical column against respective second lateral ends of the first and second data center racks, a width of each of the first and second data center racks being measured between the first lateral end and the second lateral end thereof.

In some embodiments, the first lateral side attachment brackets and the second lateral side attachment brackets are fastened to lower portions of the first and second data center racks.

In some embodiments, the first lateral side attachment brackets are left attachment brackets; the second lateral side attachment brackets are right attachment brackets; the left attachment brackets comprise front left attachment brackets and rear left attachment brackets spaced from the front left attachment brackets in the depth direction of the rack column assembly; the right attachment brackets comprise front right attachment brackets and rear right attachment brackets spaced from the front left attachment brackets in the depth direction of the rack column assembly; fastening the left attachment brackets comprises: fastening first and second ones of the front left attachment brackets to first front surfaces on front sides of the first and second data center racks respectively; and fastening first and second ones of the rear left attachment brackets to first rear surfaces on rear sides of the first and second data center racks respectively; and fastening the right attachment brackets comprises: fastening first and second ones of the front right attachment brackets to second front surfaces on the front sides of the first and second data center racks respectively; and fastening first and second ones of the rear right attachment brackets to second rear surfaces on the rear sides of the first and second data center racks respectively.

In some embodiments, the method further comprises stacking a third data center rack atop the second data center rack such that the second data center rack supports the third data center rack, the first vertical column being placed on a first lateral side of the third data center rack, the second vertical column being placed on a second lateral side of the third data center rack; and said installing further comprises: connecting the first vertical column to the third data center rack by fastening two of the first lateral side attachment brackets to the third data center rack, the two of the first lateral side attachment brackets including a front first lateral side attachment bracket and a rear first lateral side attachment bracket spaced from the front first lateral side attachment bracket in the depth direction of the rack column assembly; and connecting the second vertical column to the third data center rack by two of the second lateral side attachment brackets to the third data center rack, the two of the second lateral side attachment brackets including a front second lateral side attachment bracket and a rear second lateral side attachment bracket spaced from the front second lateral side attachment bracket in the depth direction of the rack column assembly.

In some embodiments, a method for arranging data center racks in a data center comprises: assembling a first rack column assembly according to the method; assembling a second rack column assembly according to the method, the second rack column assembly being spaced apart from the first rack column assembly to define an aisle therebetween; and interconnecting the first and second rack column assemblies via at least one intercolumn connector extending from an upper portion of the first rack column assembly to an upper portion of the second rack column assembly.

According to another aspect of the present technology, there is provided a rack column assembly for a data center comprising: a first data center rack positioned on a support surface; a second data center rack stacked atop the first data center rack such that the first data center rack supports the second data center rack, the first and second data center racks having respective front sides, the first and second data center racks being configured to receive electronic equipment for storage therein via the front sides; and a retaining system configured to prevent relative movement of the first and second data center racks of the rack column assembly, the retaining system comprising: a left vertical column positioned on a left side of the first and second data center racks, the left vertical column being abutted against respective left ends of the first and second data center racks; a right vertical column positioned on a right side of the first and second data center racks, the right vertical column being abutted against respective right ends of the first and second data center racks; a plurality of left attachment brackets connecting the left vertical column to the first and second data center racks, the plurality of left attachment brackets including front left and rear left attachment brackets connected to the left vertical column and extending toward the right vertical column, the front left attachment brackets being spaced from the rear left attachment brackets in a depth direction of the rack column assembly, each of the first and second data center racks being fastened to a corresponding one of the front left attachment brackets and to a corresponding one of the rear left attachment brackets; and a plurality of right attachment brackets connecting the right vertical column to the first and second data center racks, the plurality of right attachment brackets including front right and rear right attachment brackets connected to the right vertical column and extending toward the left vertical column, the front right attachment brackets being spaced from the rear right attachment brackets in a depth direction of the rack column assembly, each of the first and second data center racks being fastened to a corresponding one of the front right attachment brackets and to a corresponding one of the rear right attachment brackets.

In some embodiments, the left vertical column and the right vertical column are connected to the support surface.

In some embodiments, the first data center rack comprises guiding means on an upper surface thereof configured to guide a position of the second data center rack relative to the first data center rack along the depth direction of the rack column assembly.

In some embodiments, the rack column assembly comprises a third data center rack stacked atop the second data center rack such that the second data center rack supports the third data center rack; the left vertical column is positioned on a left side of the third data center rack, the left vertical column being abutted against a left end of the third data center rack; the right vertical column is positioned on a right side of the third data center rack, the right vertical column being abutted against a right end of the third data center rack; and the third data center rack is fastened to one of the front left attachment brackets, to one of the rear left attachment brackets, to one of the front right attachment brackets, and to one of the rear right attachment brackets.

In some embodiments, each of the left and right vertical columns comprises a formed panel extending along at least a majority of a depth of the respective one of the left and right vertical columns; the front left and front right attachment brackets are connected to a front end of the formed panel; and the rear left and rear right attachment brackets are connected to a rear end of the formed panel.

In some embodiments, the formed panel is a single piece of sheet metal bent into shape.

In some embodiments, a cross-sectional profile of the formed panel taken along a horizontal plane has a step-function shape including: three longitudinal parts corresponding to two coplanar walls of the formed panel and a central wall disposed therebetween; and two lateral parts corresponding to two inner side walls linking the coplanar walls to the central wall.

In some embodiments, a middle channel is defined between the central wall and the two inner side walls; a front channel defined between a front one of the two coplanar walls, a front one of the two inner side walls, and a front one of two outer side walls of the formed panel, the two outer side walls extending from respective ones of the two coplanar walls and being parallel to the two inner side walls; and a rear channel defined between a rear one of the two coplanar walls, a rear one of the two inner side walls, and a rear one of the two outer side walls.

In some embodiments, a width of each one of the left and right vertical columns is less than 80 mm.

In some embodiments, the width of each one of the left and right vertical columns is approximately 60 mm.

In some embodiments, each of the left and right attachment brackets is pivotally connected to a corresponding one of the left vertical column and the right vertical column about a pivot axis extending in the depth direction of the rack column assembly.

In some embodiments, at least one of the left or right attachment brackets comprises: an inwardly-extending portion connected to a corresponding one of the first and second data center racks; and an outwardly-extending portion extending in an opposite direction from the inwardly-extending portion and configured to be connected to data center racks of a second rack column assembly adjacent to the rack column assembly.

In the present description, various terms relating to spatial orientation such as "front", "rear", "top", "bottom", "left", "right", "upward", "downward", etc. will be used to provide a clear description of the present technology. However, it is understood that these terms are merely used to improve the clarity of the description and in no way are meant to be limiting in regard to orientation.

Embodiments of the present technology each have at least one of the above-mentioned objects and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of embodiments of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where.

DETAILED DESCRIPTION

Figure 1:
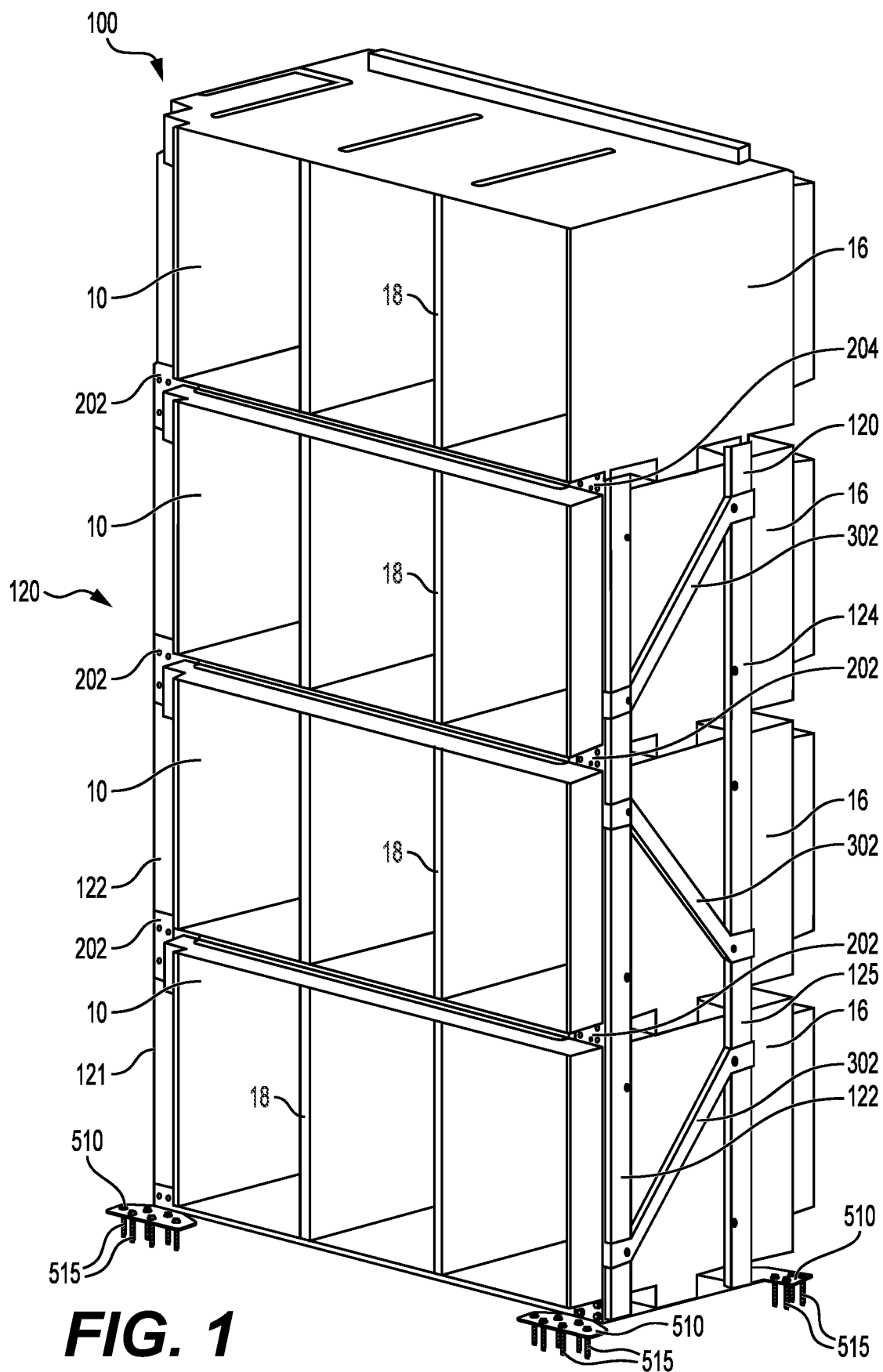
FIG. 1 is a perspective view, taken from a front, top, right side, of a rack column assembly according to an embodiment of the present technology.
Figure 2:
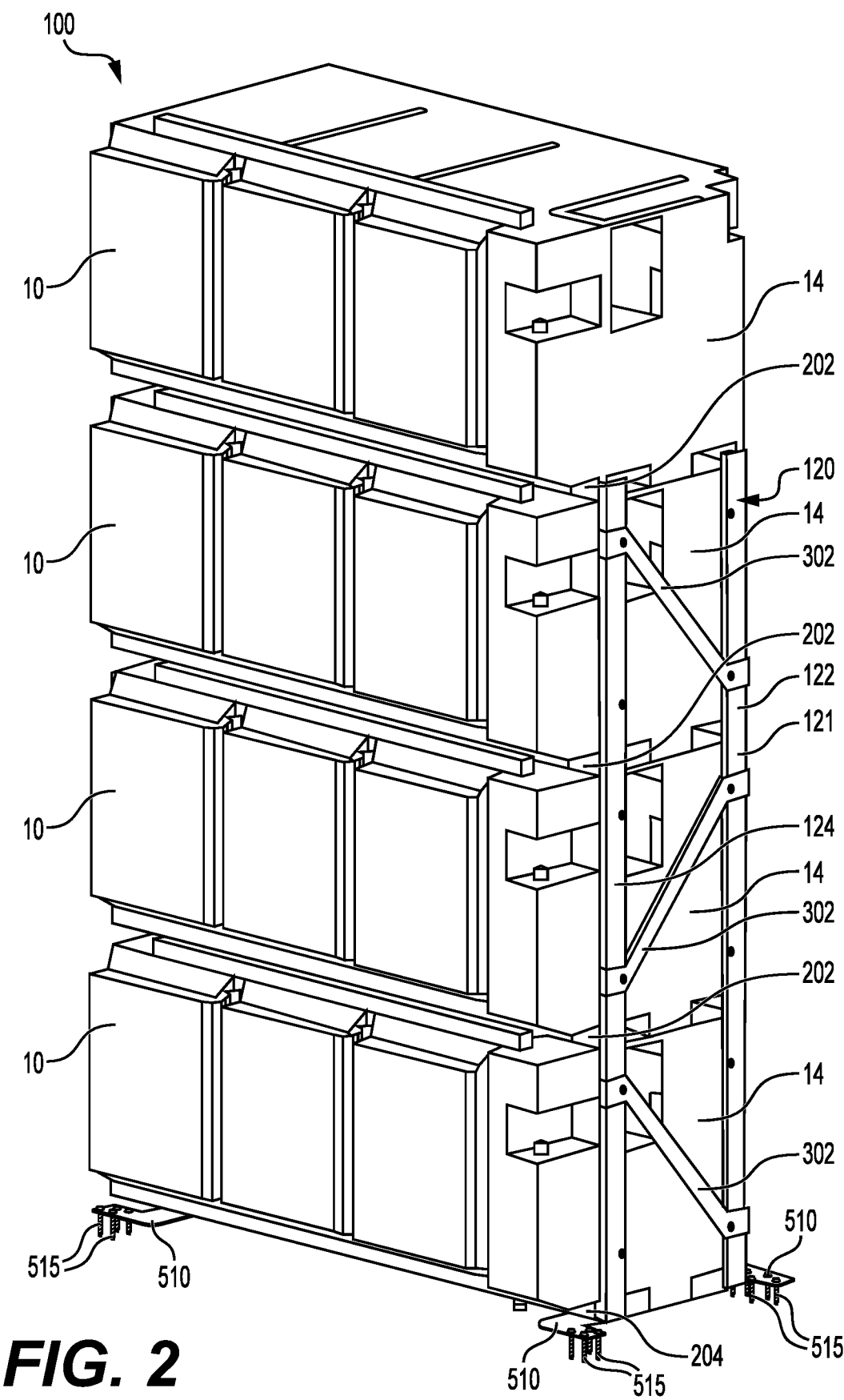
FIG. 2 is a perspective view, taken from a rear, top, left side, of the rack column assembly of FIG. 1.

FIGS. 1 and 2 illustrate a rack column assembly 100 for a data center including a plurality of racks 10 stacked atop one another and a retaining system 120 connected to the racks 10. The racks 10 are configured to support data center equipment therein, including for example computer systems such as servers and related supporting equipment (e.g., heat exchangers for heat dissipation of the computer systems). As such, the racks 10 may be referred to as "data center racks" or "server racks". In use, in a data center, various such rack column assemblies 100 may be aligned in rows spaced apart from one another to help manage heat within the data center. In this embodiment, the rack column assembly 100 is illustrated as including four racks stacked atop one another. However, it is contemplated that the rack column assembly 100 could include more or fewer racks 10.

As will be described in greater detail below, the retaining system 120 is configured to consolidate the racks 10 of the rack column assembly 100 as a unit in order to better handle the forces that could be exerted on the rack column assembly 100 in the event of seismic activity or other vibration-inducing event (e.g., a forced being applied on the rack column assembly 100). In particular, the retaining system 120 limits relative movement of the racks 10 of the rack column assembly 100 such that the racks 10 remain in place during seismic activity.

Figure 3:
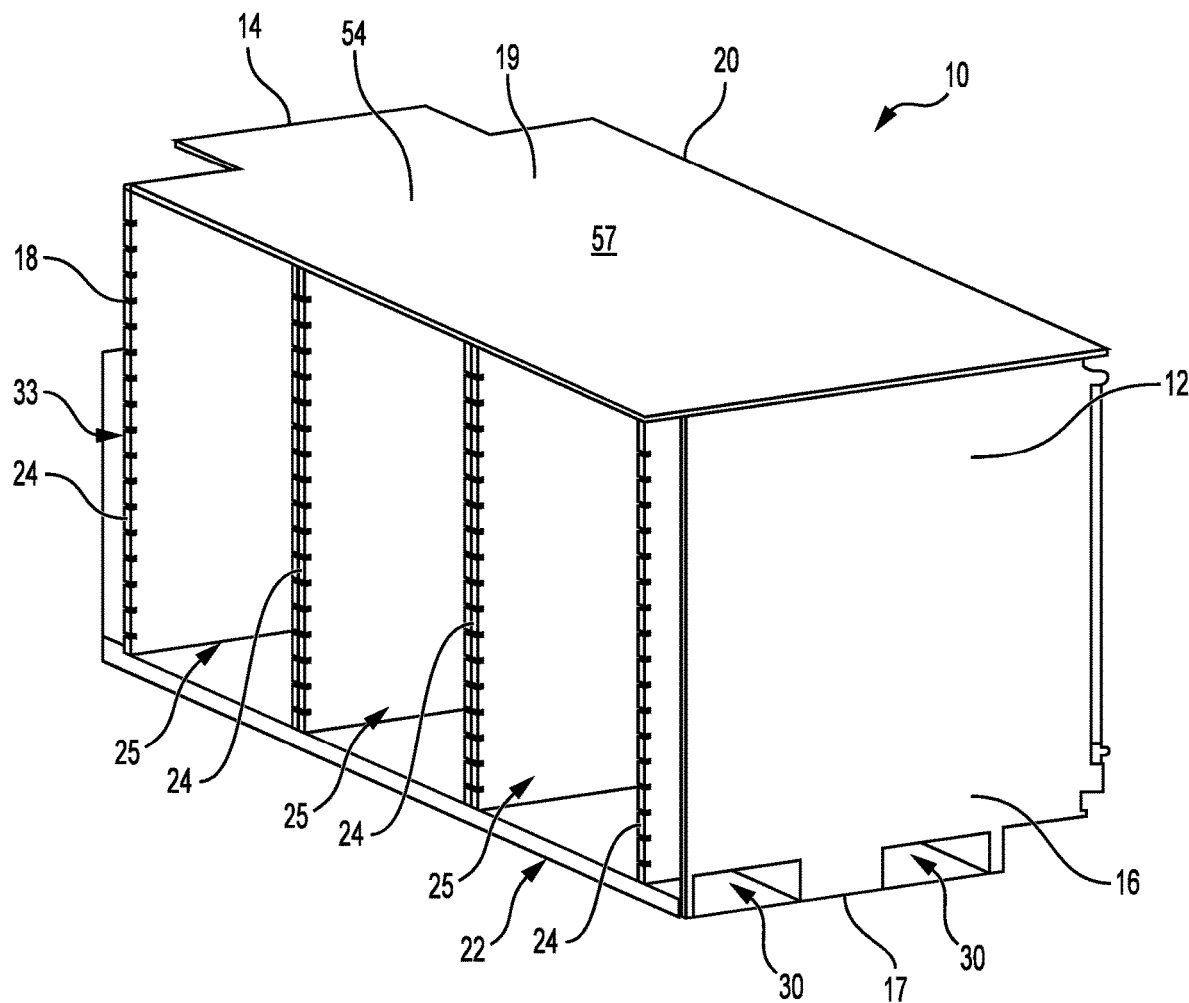
FIG. 3 is a perspective view, taken from a front, top, right side, of a rack of the rack column assembly of FIG. 1.
Figure 4:
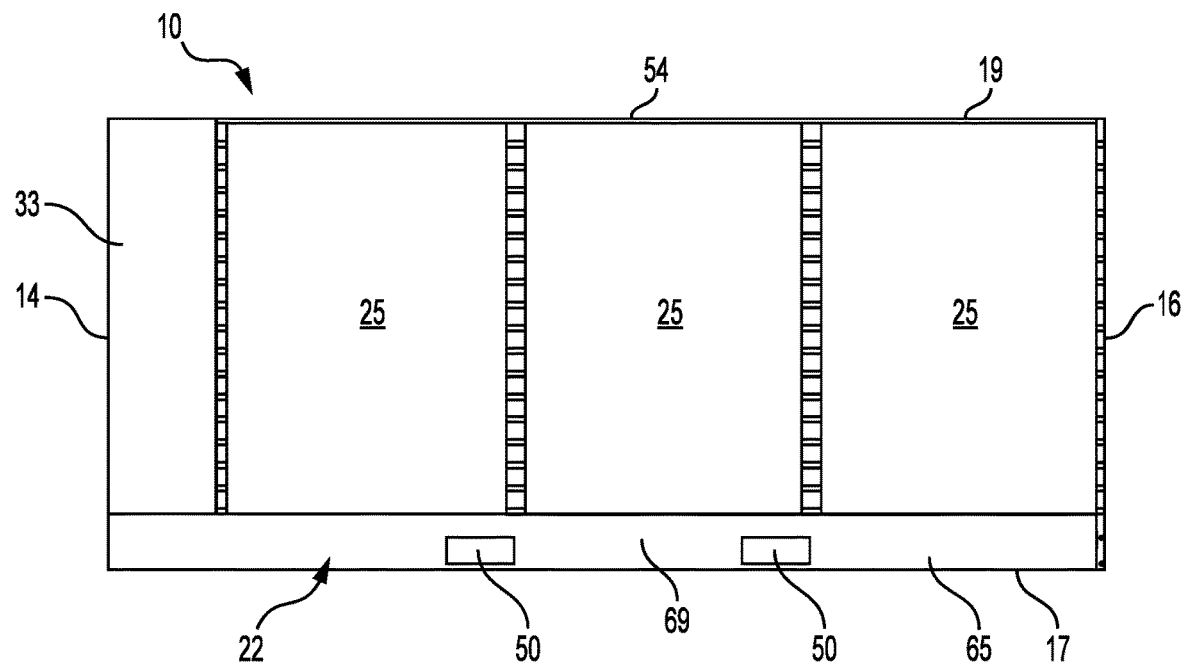
FIG. 4 is a front elevation view of the rack of FIG. 3.
Figure 5:
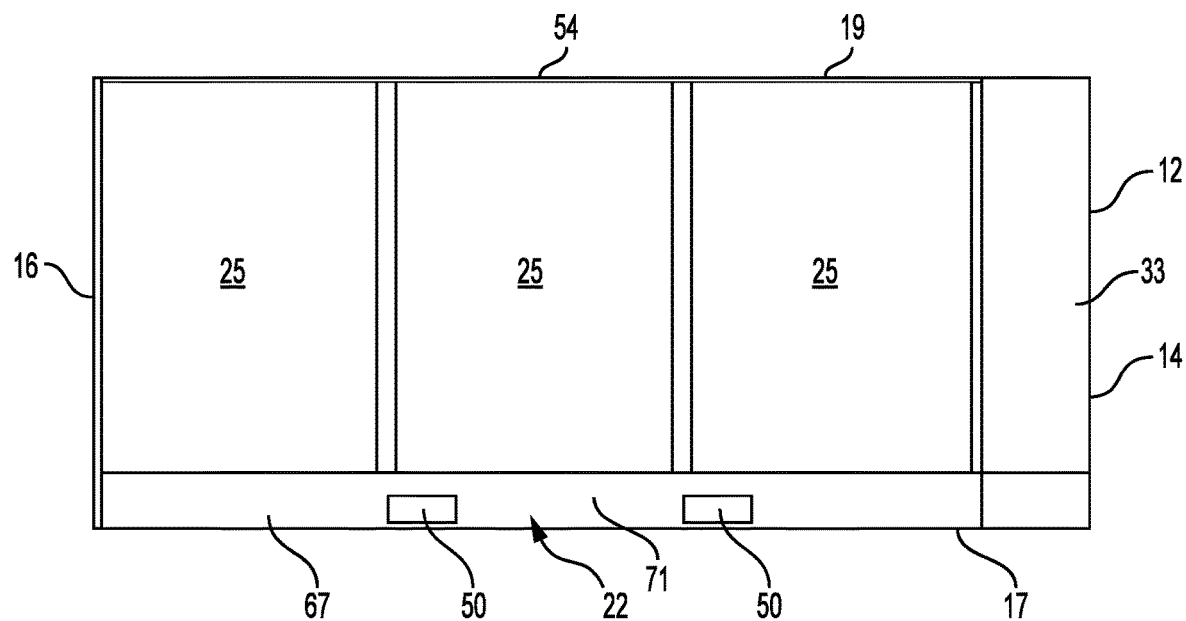
FIG. 5 is a rear elevation view of the rack of FIG. 3.

The racks 10 will now be described generally with reference to FIGS. 3 to 5. As can be seen, each rack 10 has a left lateral end 14 and a right lateral end 16 which are opposite one another in a lateral direction. A front end 18 is disposed on a front side of the rack 10 and a rear end 20 on a rear side of the rack 10. The front side of the rack 10 corresponds to the side through which the electronic equipment (e.g., servers) stored therein is accessible. In other words, the electronic equipment is inserted into and removed from the rack 10 via the front side of the rack 10.

As can be seen, in this embodiment, the rack 10 has a greater width, measured between the lateral ends 14, 16, than a height thereof, measured between a lower end 17 and an upper end 19 of the rack 10. As such, the rack 10 can be said to be horizontally-extending rather than vertically-extending.

A frame 12 of the rack 10 has a base 22 defining a bottom portion of the rack 10. As shown in FIGS. 4 and 5, the base 22 has a front wall 65 on the front side of the rack 10 and a rear wall 67 on the rear side of the rack 10. The front and rear walls 65, 67 have respective front and rear surfaces 69, 71 that are generally parallel to each other and to a plane extending generally laterally and vertically. The frame 12 also has a plurality of vertical wall supports 24 that are fastened to the base 22 and extend upwardly therefrom. The vertical wall supports 24 are laterally spaced from one another so as to define housing sections 25 therebetween. In this embodiment, the frame 12 includes four vertical wall supports 24 which define three housing sections 25 between consecutive ones of the vertical wall supports 24. In use, the housing sections 25 receive the electronic equipment that is supported by the rack 10. For instance, the electronic equipment housed by the housing sections 25 includes servers and associated supporting electronic equipment (e.g., networking equipment). Notably, a plurality of mounts (not shown) may be connected to the vertical wall supports 24 for the servers or other electronic equipment to be mounted thereto. The front side of the rack 10 corresponds to the side of the rack 10 through which the electronic equipment is inserted and removed from the housing sections 25.

In this embodiment, at the left lateral end 14, the frame 12 has an end frame enclosure 33 for housing additional equipment to service the servers supported by the rack 10. The end frame enclosure 33 includes two sheet metal components that are mechanically fastened to the base 22 and extend upwardly therefrom. The end frame enclosure 33 may be omitted in other embodiments.

An upper frame member 54 extends parallel to the base 22 and defines at least in part the upper end 19 of the rack 10. The upper frame member 54 interconnects the upper ends of the vertical wall supports 24 as well as the upper end of the end frame enclosure 33. In this embodiment, the upper frame member 54 is a generally planar sheet metal component that is fastened to the upper ends of the vertical wall supports 24 and the upper end of the end frame enclosure 33. The upper frame member 54 has an upper surface 57 (FIG. 3) that defines the upper end 19 of the rack 10.

In this embodiment, the rack 10 is designed to be lifted by a forklift or other lifting machine having a fork (e.g., a stacker or a pallet jack). To that end, as shown in FIGS. 4 and 5, the base 22 defines two openings 50, extending from the front wall 65 of the base 22 on the front side of the rack 10 to the rear wall 67 of the base 22 on the rear side of the rack 10, for receiving a fork of the lifting machine along a depth direction. More specifically, each opening 50 can receive a respective arm of the fork of the lifting machine. As shown in FIG. 3, in this embodiment, the rack 10 also defines two openings 30 extending in the lateral direction, from one lateral end of the base 22 to the opposite lateral end of the base 22, for receiving a fork of the lifting machine along the lateral direction. In other embodiments, the openings 30 may be omitted.

As will be appreciated, each rack 10 has a center of gravity which can be acted upon by external forces such as those caused by seismic activity. Therefore, when the racks 10 are stacked and unsecured (i.e., without installing the retaining system 120), the racks 10 could move significantly relative to one another if subjected to a force that is large enough. In order to limit such relative movement between the racks 10, the retaining system 120 is installed once the racks 10 have been stacked atop one another.

Returning now to FIG. 1, in order to form the rack column assembly 100, one of two lateral side vertical columns 121, 125 of the retaining system 120 is first positioned in place on a support surface 500 (FIG. 9) (e.g., a ground surface of the data center). As can be seen, the lateral side vertical columns 121, 125 are configured to be on opposite lateral sides of the racks 10 of the rack column assembly 100 and may therefore be referred to as a left vertical column 121 and a right vertical column 125 respectively. In this example, the left vertical column 121 is first positioned in its place on the support surface 500. It is contemplated that, in other embodiment, the right vertical column 125 could be the one that is first positioned in its place. In this embodiment, the left vertical column 121 is a mirror image of the right vertical column 125 and therefore only the left vertical column 121 will be described in detail herein. It is to be understood that the same description applies to the right vertical column 125.

In this embodiment, the left vertical column 121 includes a front vertical member 122 and a rear vertical member 124 spaced from each other in a depth direction of the rack column assembly 100 (alternatively referred to as a front-to-rear direction). The depth direction is normal to the lateral direction of the rack column assembly 100 as the depth direction extends from the front sides of the racks 10 to the rear sides of the racks 10. The front and rear vertical members 122, 124 are laterally aligned with each other and are connected via brace members 302 extending in the depth direction of the rack column assembly 100. In this example, the front and rear vertical members 124 are generally elongated members. In this embodiment, each of the vertical members 122, 124 is a single-piece component. In other words, each of the vertical members 122, 124 is an integrally made component that extends from the bottommost rack 10 to the topmost rack 10 of the rack column assembly 100. However, it is contemplated that, in other embodiments, each of the vertical member 122, 124 could be made of multiple components that are fastened to one another (e.g., a plurality of segments assembled together to make up each vertical member 122, 124).

In this example, three brace members 302 interconnect the front and rear vertical members 122, 124. More or fewer brace members 302 may be provided in other embodiments. Each of the brace members 302 defines openings for receiving a respective fastener 313 (FIG. 6) that connects the brace member 302 to the vertical members 122, 124. In this example, each of the brace members 302 extends in the depth direction and in a height direction of the rack column assembly 100. In other words, each of the brace members 302 extends diagonally from the front vertical member 122 to the rear vertical member 124.

Figure 6:
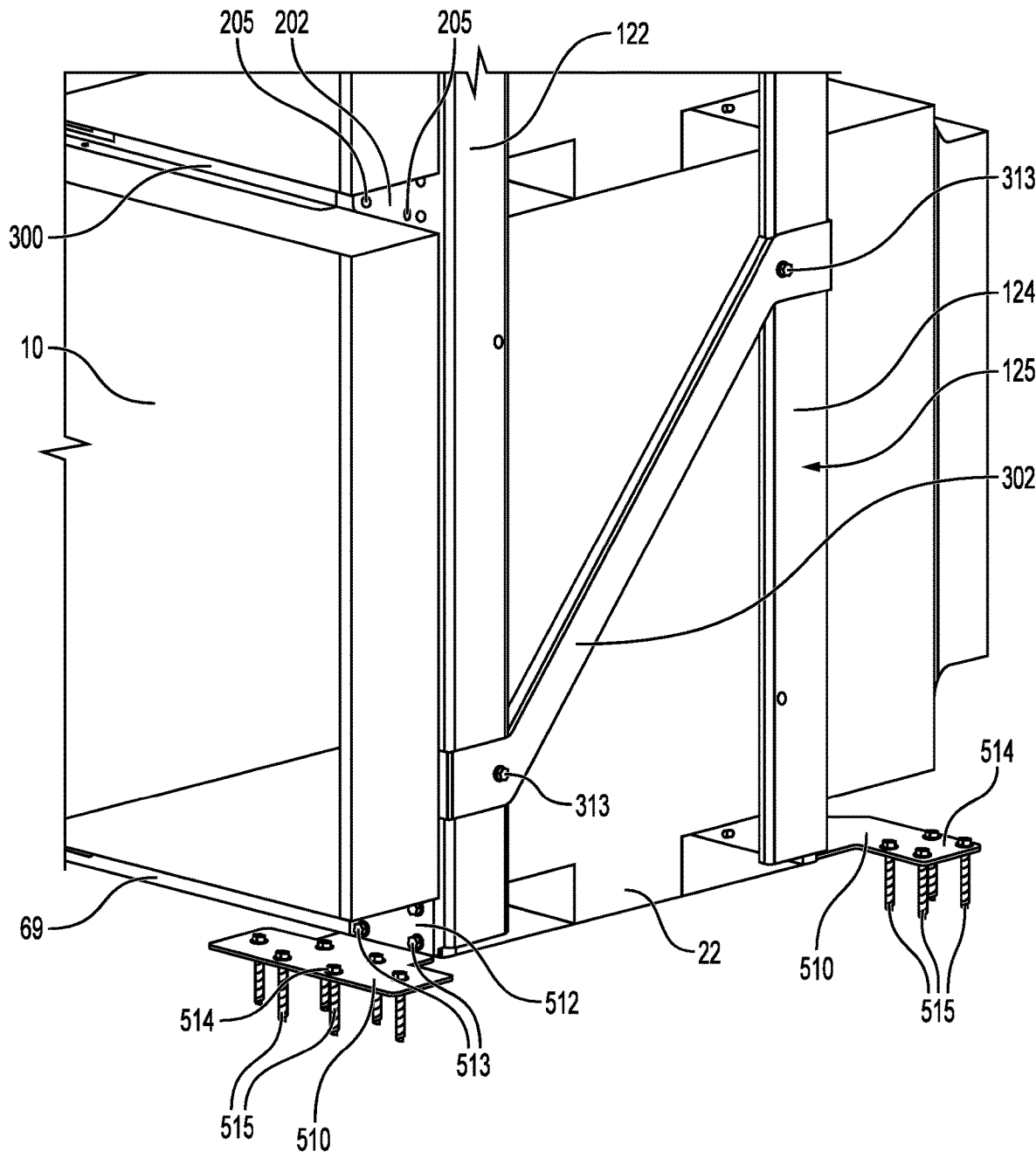
FIG. 6 is a perspective view, taken from a front, top, right side, of part of the rack column assembly of FIG. 1, showing part of a retaining system of the rack column assembly.

As shown in FIGS. 1 and 2, in this embodiment, at a bottom portion thereof, the left vertical column 121 also includes two surface support plates 510 for supporting the left vertical column 121 on the support surface 500. In particular, the front vertical member 122 and the rear vertical member 124 are connected, at their respective bottom ends, to a corresponding one of the surface support plates 510 which is supported on the support surface 500. In this embodiment, the surface support plates 510 are fastened to the support surface 500 and may therefore be referred to as surface attachment plates. As shown in FIG. 6, each surface support plate 510 has an upright portion 512 defining a first set of openings (not shown) for receiving fasteners 513 (e.g., bolts) that connect the upright portion 512 to the bottom portion of a respective one of the vertical members 122, 124. Each surface support plate 510 also has a horizontal portion 514 extending horizontally from the upright portion 512 and defining a second set of openings (not shown) for receiving fasteners 515 (e.g., bolts) that connect the horizontal portion 514 to the support surface 500. In this embodiment, each surface support plate 510 is made of a single piece of sheet metal bent into shape.

It is contemplated that the surface support plates 510 may be configured differently in other embodiments (e.g., having different shapes and/or connected to different parts of the vertical members 122, 124). Moreover, it is contemplated that, in some embodiments, the surface support plates 510 may not be fastened to the support surface 500.

Once the left vertical column 121 has been installed, a first one of the racks 10 is disposed on the support surface 500 and abutted against the left vertical column 121. The first one of the racks 10, which may also be referred to as a bottommost rack 10 of the rack column assembly 100, is then connected to the left vertical column 121 via the upright portion 512 of each of the surface support plates 510. Notably, in this example, the upright portion 512 is also fastened to the base 22 of the bottommost rack 10 by some of the fasteners 513 in addition to being fastened to the vertical members 122, 124.

Figure 7:
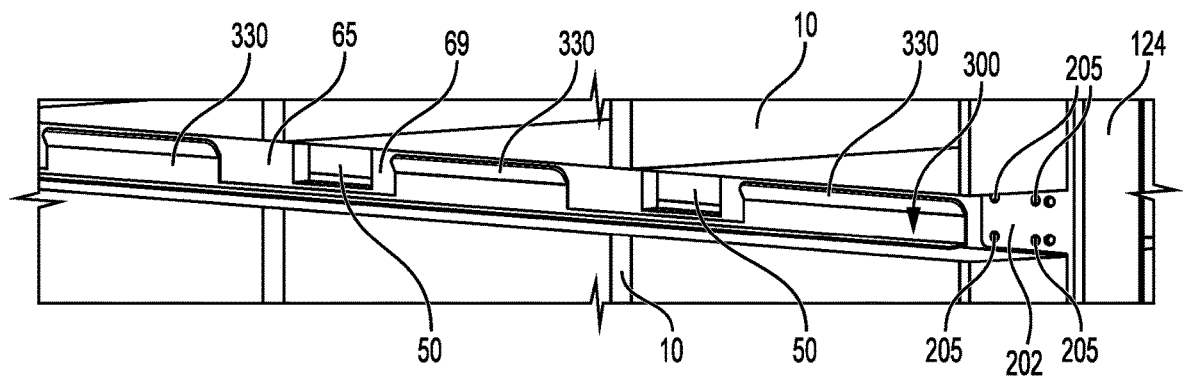
FIG. 7 is a perspective view, taken from a front, top, right side, of part of the rack column assembly of FIG. 1, showing a guiding member.
Figure 8:
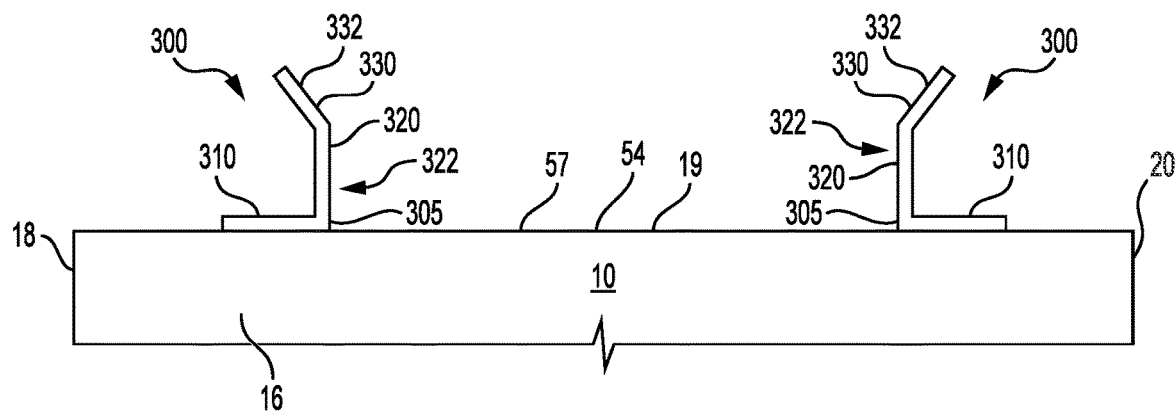
FIG. 8 is a right side elevation view of part of a rack of the rack column assembly of FIG. 1, showing a pair of the guiding members of FIG. 7 connected thereto.

With the bottommost rack 10 in place and in position, in this embodiment, as best shown in FIGS. 7 and 8, guiding means 300 are installed on the bottommost rack 10, namely connected to the upper surface 57 of the rack 10 for guiding the positioning of the next rack 10 relative to the bottommost rack 10 as it is being stacked atop the bottommost rack 10. In this embodiment, the guiding means 300 are guiding members 300 that are configured to be affixed to the upper surfaces 57 of the racks 10. In particular, in this example, as best shown in FIG. 8, two guiding members 300, namely front and rear guiding members 300 (i.e., spaced in the depth direction of the rack column assembly 100), are affixed to the upper end 19 of each rack 10. The guiding members 300 extend along at least a majority of the width of the racks 10. In this embodiment, the front and rear guiding members 300 of each rack 10 are a mirror image of another about a vertical plane extending laterally and disposed between both guiding members 300.

As shown in FIG. 8, each guiding member 300 has a horizontally-extending portion 310 which is fastened to the upper end 19 of the rack 10, and a vertically-extending portion 320 extending from the horizontally-extending portion 310 at an inner end 305 thereof (i.e., the end of the horizontally-extending portion 310 that is closest to a midpoint between the front and rear ends 18, 20 of the corresponding rack 10). In this embodiment, as shown in FIG. 7, the vertically-extending portion 320 has three guiding arms 330 spaced apart from one another. A distance between two consecutive guiding arms 330 is equal to or greater than a width of the openings 50 to leave the openings 50 uncovered by the vertically-extending portion 320 such that the fork of the lifting machine may be received thereby. In this embodiment, an upper portion 332 of each guiding arm 330 extends at an angle with respect to a vertical axis in order to help situate the second rack 10 atop the first rack 10. In particular, the upper portion 332 of each guiding arm 332 is inclined to center the second rack 10 relative to the first rack 10 if the second rack 10 is lowered onto the upper portions 332 of the guiding arms 330. In this embodiment, the guiding members 300 are made of bent sheet metal.

A distance between the front and rear guiding members 300 is equal to or slightly greater than a length of the lower end 17 (i.e. a distance between the front wall 65 and the rear wall 67 of the base 22) of the second rack 10 to be stacked atop the first rack 10. As such, upon stacking the second rack 10 atop the first rack 10, a surface of the vertically-extending portions 320 on an inner side 322 of each of the front and rear guiding members 300 may abut a portion of the front wall 65 and/or the rear wall 67 of the base 22 of the second rack 10. As such, in this embodiment, a position of the second rack 10 along a depth direction of the rack column assembly 100 and relative to the first rack 10 is guided by the front and rear guiding members 300 as the second rack 10 is being lowered atop the first rack 10.

The guiding means 300 could be configured differently in other embodiments. For instance, in other embodiments, the guiding means 300 could be one or more protrusions on the upper surface 57 of the first rack 10 and corresponding recesses defined on a bottom surface (not shown) of the second rack 10, or vice-versa. It is contemplated that the guiding means 300 could be omitted in other embodiments.

With the second rack 10 in place on the bottommost rack 10, as shown in FIGS. 1, 2 and 6, in this embodiment, front left and rear left attachment brackets 202 are connected to the second rack 10. Each of the front left and rear left attachment brackets 202 is connected to a respective one of the vertical members 122, 124 of the left vertical column 121. As can be seen, the attachment brackets 202 are connected to and extend laterally inwardly from (i.e., towards a plane bisecting the width of the racks 10) the front and rear vertical members 122, 124 of the left vertical column 121 (i.e., towards the location of the right vertical column 125 that will be installed afterwards).

In this embodiment, each attachment bracket 202 is fastened to the base 22 of the corresponding rack 10 (i.e., to the lower portion of the rack 10). Thus, as can be seen, the attachment brackets 202 connected to a given one of the vertical members 122, 124, are equally vertically spaced from one another to be aligned with the base 22 of the corresponding rack 10. Moreover, the attachment brackets 202 configured to be connected to a particular one of the racks 10 are all vertically aligned with each other. For each rack 10, the attachment brackets 202 connected to the front vertical member 122 are fastened to the front wall 65 of the base 22 of the rack 10 while the attachment brackets 202 that are connected to the rear vertical member 124 are fastened to the rear wall 67 of the base 22 of the rack 10. Notably, in this embodiment, each of the attachment brackets 202 defines a plurality of openings 205 (FIGS. 6, 7) through which fasteners (e.g., bolts) (not shown) are inserted to connect the front and rear vertical members 122, 124 to the racks 10. The depth of the base 22 of the rack 10 therefore corresponds to the distance between the attachment brackets 202 extending from the front vertical member 122 and the rear vertical member 124. As will be appreciated, the base 22 of each of the racks 10 is therefore retained in the depth direction between the front and rear ones of the attachment brackets 202 (i.e., the attachment brackets 202 connected to the front and rear vertical members 122, 124 respectively).

The third rack 10 is stacked atop the second rack 10 in the same manner as the second rack 10 is stacked atop the bottommost rack 10, and front left and rear left attachment brackets 202 are similarly connected to the third rack 10 thereafter. The fourth rack 10 is also stacked in the same manner atop the third rack 10, and front left and rear left attachment brackets 202 are similarly connected to the third rack 10 thereafter. The number of racks 10 in the rack column assembly 100 is not limitative. Indeed, as mentioned above, more or fewer racks 10 could be included in the rack column assembly 100 in other embodiments.

In this embodiment, the attachment brackets 202 are integral with the vertical members 122, 124. That is, each of the vertical members 122, 124 and the corresponding attachment brackets 202 are formed together such that a continuous material forms each vertical member 122, 124 and the corresponding attachment brackets 202. It is contemplated that, in other embodiments, the attachment brackets 202 could be distinct components that are fastened to the vertical members 122, 124 (e.g., via bolts, or welding, etc.). In such a case, the attachment brackets 202 corresponding to a given one of the racks 10 are installed right after that rack 10 has been supported on either the support surface 500 (if it is the bottommost rack 10) or on another rack 10.

The right vertical column 125 can then be installed. Notably, the right vertical column 125 is abutted against the right lateral ends 16 of the racks 10 to place the right vertical column 125 in its position. The right vertical column 125 is optionally affixed to the support surface 500 (similarly to the left vertical column 121), and the right attachment brackets 202 are affixed to the racks 10 in a similar manner as described above with respect to the left vertical column 121. As such, the vertical members 122, 124 of the left vertical column 121 are positioned such as to abut the left lateral ends 14 of the racks 10 while he right vertical members 122, 124 are positioned such as to abut the right lateral ends 16 of the racks 10. The racks 10 are thus maintained in position along a lateral direction of the rack column assembly 100 by the front and rear vertical members 122, 124 of the left and right vertical columns 121, 125. In this embodiment, the vertical members 122, 124 extend along an entirety of the height of each rack except for the topmost rack 10. Notably, in this example, the vertical members 122, 124 only extend to the base 22 of the topmost rack 10. It is contemplated that, in other embodiments, the vertical members 122, 124 could also extend along a majority or an entirety of the height of the topmost rack 10.

As will be appreciated, the racks 10 of the rack column assembly 100 are stacked atop one another such that the bottommost one of the racks 10 (i.e., the rack 10 that is closest to a support surface on which the rack column assembly is supported) supports at least most of the weight of all of the racks 10 that are stacked thereabove. In cases where the left and right vertical columns 121, 125 are affixed to the support surface 500, some of the weight is transferred over to the support surface 500.

As will be understood from the above, the retaining system 120 secures the racks 10 of the rack column assembly 100 together in order to prevent potential movement of one of the racks 10 relative to the other racks 10. Notably, by connecting the racks 10 to one another as described above via the retaining system 120, for purposes of calculating the effect of external forces generated by seismic activity on the racks 10, a single center of gravity of the rack column assembly 100 consolidating the individual centers of gravity of the racks 10 can be considered. The rack column assembly 100 is thus more stable, in particular as the consolidated center of gravity is positioned lower than the individual center of gravity of some of the racks 10 (e.g., the topmost rack 10). Therefore, the effects of vibrations to which the rack column assembly 100 is subjected are mitigated. As such, the retaining system 120 provides robustness to the rack column assembly 100 against external forces (e.g., seismic activity).

Figure 9:
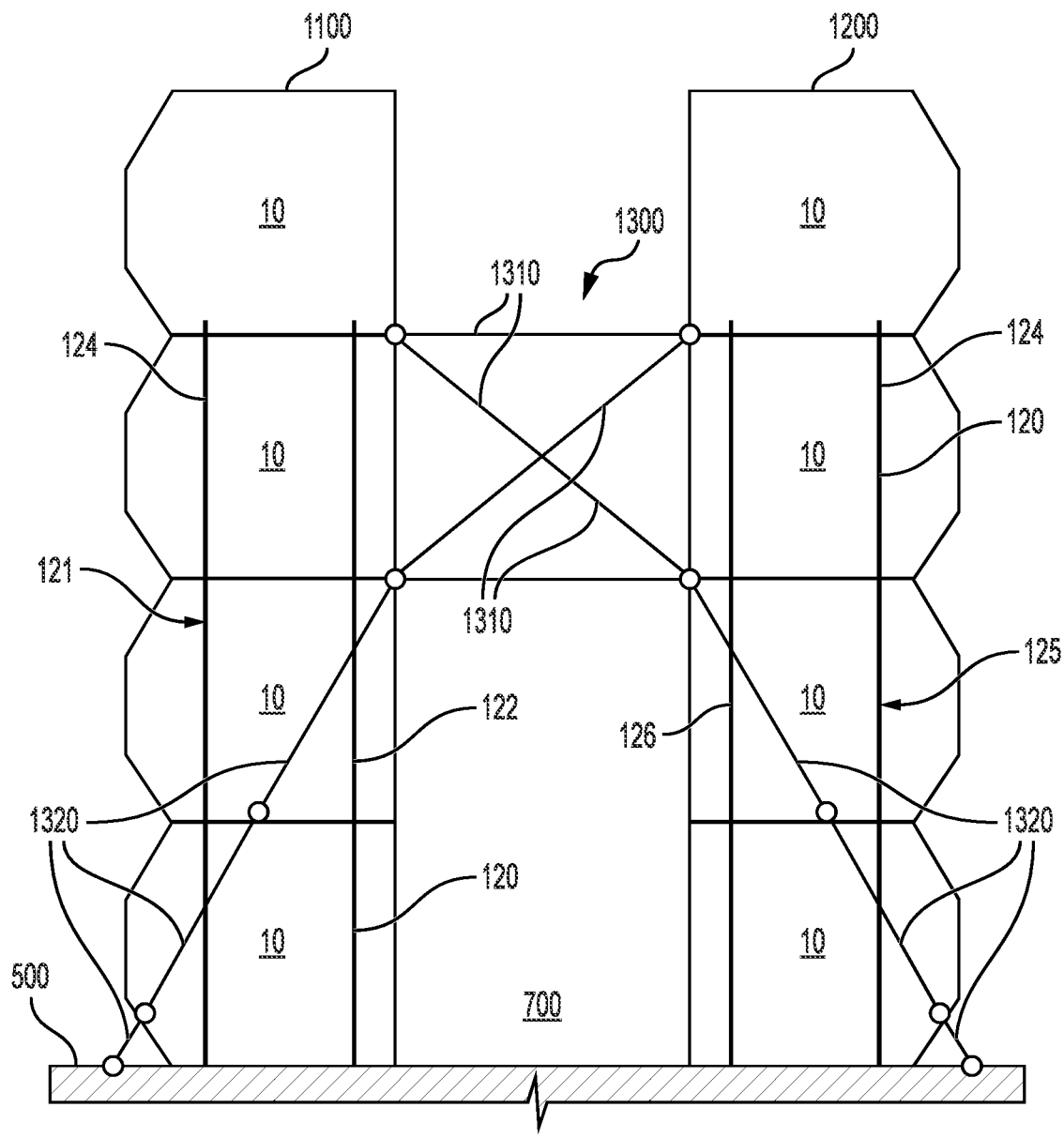
FIG. 9 is a side elevation view of two rack column assemblies interconnected according to an embodiment of the present technology.

The rack column assembly 100 can also be interconnected to another similar rack column assembly 100 in order to stabilize the rack column assemblies 100 of a data center. Notably, as shown in FIG. 9, in some cases, a data center includes first and second rack column assemblies 1100, 1200 identical to the rack column assembly 100 described above and which are spaced apart from one another to define an aisle 700 therebetween. In this embodiment, the first and second rack column assemblies 1100, 1200 are disposed such that front sides thereof are facing one another (i.e., the front ends 18 of the racks 10 of the rack column assemblies 1100, 1200 face one another). The first and second rack column assemblies 1100, 1200 are interconnected via a rack column interconnecting system 1300 that includes a plurality of intercolumn connectors 1310 securely affixed to the first and second rack column assemblies 1100, 1200. In particular, the intercolumn connectors 1310 extend from an upper portion of the first rack column assembly 1100 to an upper portion of the second rack column assembly 1200. More specifically, in this embodiment, each intercolumn connector 1310 is connected at one end to either the vertical members 122, 124 or a rack 10 of the first rack column assembly 1100 and, at an opposite end, to the vertical members 122, 124 or a rack 10 of the second rack column assembly 1200. The intercolumn connectors 1310 are disposed at a predetermined height (e.g., 2 meters) from the support surface 500 in order to interconnect the upper portions of the first and second rack column assemblies 1100, 1200. The upper portion of each of the rack column assemblies 1100, 1200 corresponds to the height at which the two uppermost racks 10 are disposed. In other words, the intercolumn connectors 1310 interconnecting the rack column assemblies 1100, 1200 are vertically aligned with at least one of the two uppermost racks 10 of each rack column assembly 1100, 1200. For instance, in this example, the intercolumn connectors 1310 are vertically aligned with the third and fourth racks 10 of the first and second rack column assemblies 1100, 1200 in order to interconnect the retaining systems 120 of the rack column assemblies 1100, 1200 at a height corresponding to the third and fourth racks 10. As will be appreciated, this can be particularly beneficial for relatively tall rack column assemblies (e.g., having three or more stacked racks 10) since their centers of gravity will naturally be vertically higher.

Furthermore, as shown in FIG. 9, in this embodiment, the rack column interconnecting system 1300 also includes a plurality of lower connectors 1320, each lower connector 1320 being connected to the first and second rack column assemblies 1100, 1200 along respective bottom portions thereof and to the support surface 500. The lower connectors 1320 extend in the vertical direction and in the depth direction of the rack column assemblies 1100, 1200. For instance, in this example, each lower connector 1320 is connected between one of the vertical members 122, 124 of each retaining system 120 and the support surface 500. The lower connectors 1320 may thus reinforce the anchoring of the rack column assemblies 1100, 1200 to the support surface 500. It is contemplated that the lower connectors 1320 could be omitted in other embodiments.

The left and right vertical columns 121, 125 may be configured differently in other embodiments. For instance, with reference to FIGS. 10 to 13, in an alternative embodiment, each of the left and right vertical columns 121, 125 includes a formed panel 235 extending along at least a majority of a depth of the respective vertical column 121, 125. The formed panel 235 of each vertical column 121, 125 has a shape that imparts rigidity to the respective vertical column 121, 125. Notably, in this embodiment, the formed panel 235 is a single piece of sheet metal that is bent into shape and therefore is relatively simple to manufacture. The formed panel 235 has two coplanar walls 240, 244 and a central wall 242 disposed between the two coplanar walls 240, 244 along the depth direction of the rack column assembly 100. As can be seen, the central wall 242 is parallel to the coplanar walls 240, 244 and laterally offset therefrom. In this example, the central wall 242 is offset laterally inwardly from the coplanar walls 240, 244. Two inner side walls 248 extend laterally between the central wall 242 and the coplanar walls 240, 244. The two inner side walls 248 and the central wall 242 together define a middle channel 247 that extends vertically. In this example, the middle channel 247 is open at its lateral outer side. The formed panel 235 also has two outer side walls 255 that extend laterally inwardly from respective ones of the two coplanar walls 240, 244 (opposite the inner side walls 248). Each outer side wall 255 defines, together with a corresponding one of the coplanar walls 240, 244 and one of the inner side walls 248, a respective one of two rectangular channels 243, 249. The channels 243, 247, 249 may be used to route electric cables and telecommunications cables to service the electronic equipment housed by the racks 10.

Figure 12:
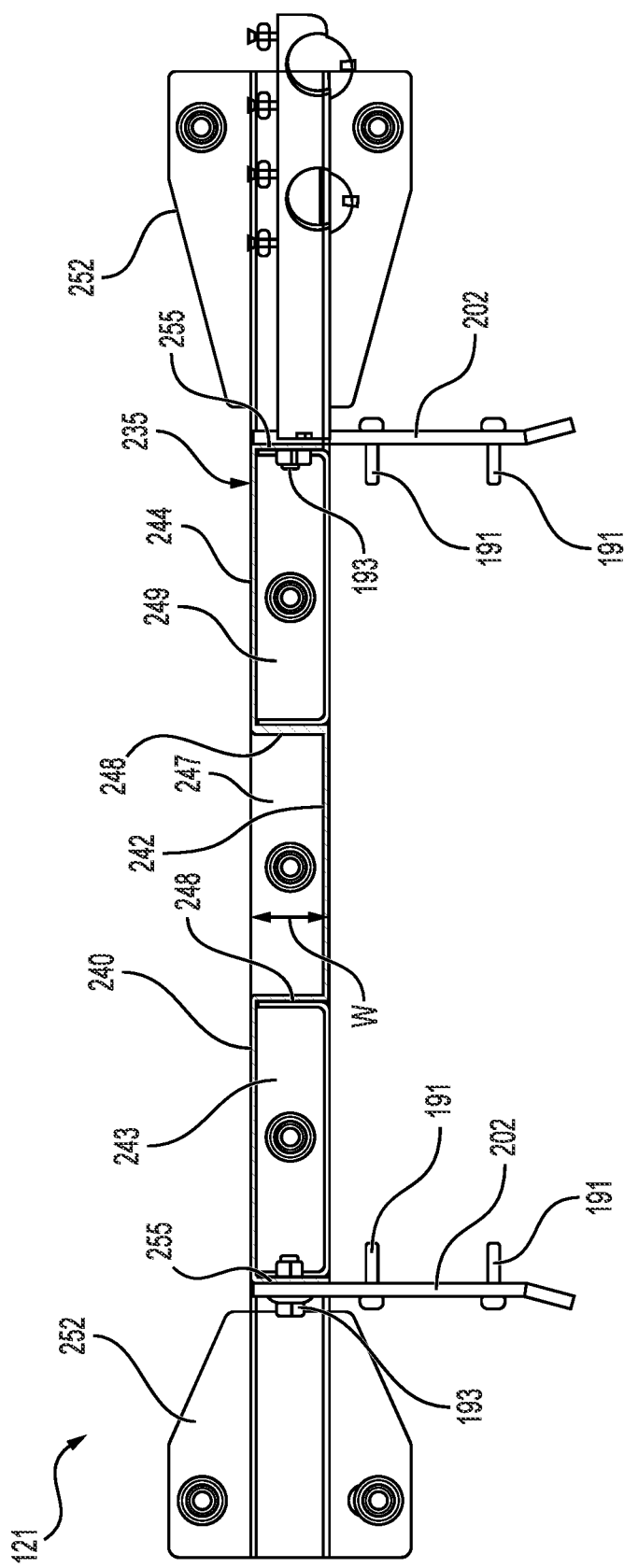
FIG. 12 is a cross-sectional view of a left vertical column of the rack column assembly of FIG. 10 taken along line 12-12 in FIG. 10.
Figure 13:
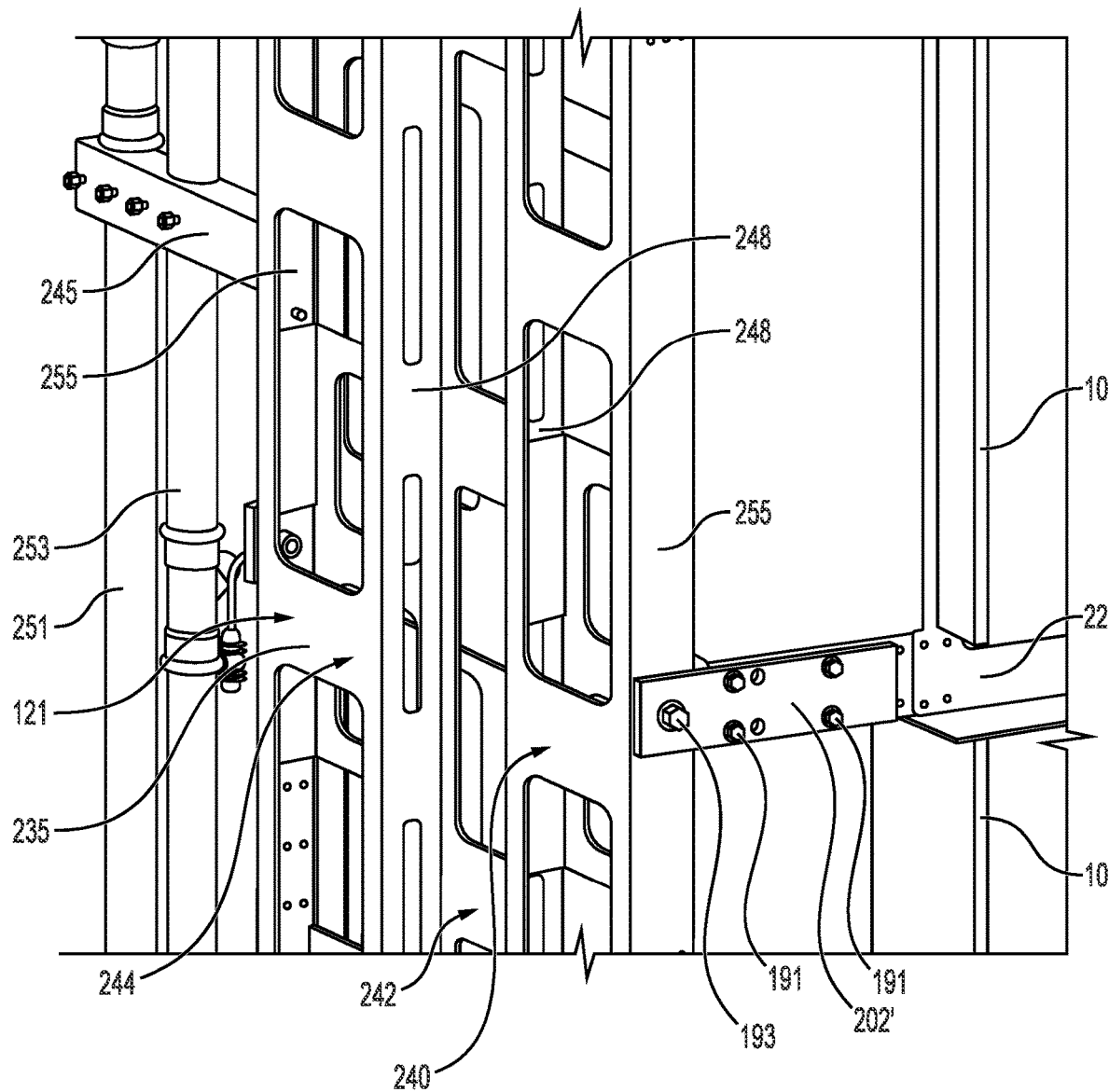
FIG. 13 is a perspective view, taken from a top, front, left side of part of the rack column assembly of FIG. 10.

As shown in FIG. 12, a cross-sectional profile of the formed panel 235 taken along a horizontal plane thus has a step-function shape including three longitudinal parts ("plateaus") corresponding to the two coplanar walls 240, 244 and the central wall 242 and at least two lateral parts corresponding to the inner side walls 248 linking the coplanar walls 240, 244 to the central wall 242. In this example, the cross-sectional profile of the formed panel 235 has four lateral parts corresponding to the two inner side walls 248 and the two outer side walls 255.

This configuration of the formed panel 235 provides a robust structure that can resist moments tending to bend the corresponding vertical column 121, 125 about an axis extending in the depth direction of the rack column assembly 100. While the formed panels 235 do not impart significant rigidity to the vertical column 121, 125 in the lateral direction such that, in isolation, the vertical columns 121, 125 are not particularly resistant to bending moments tending to bend the vertical columns 121, 125 about a vertical axis, the fixed arrangement of the left vertical column 121, the racks 10, and the right vertical column 125 is statically overdetermined to resist seismic activity. Moreover, the left and right vertical columns 121, 125 have a relatively small width (i.e., a distance between the left and right ends of the respective vertical column 121, 125). For instance, a width W (FIG. 12) of each vertical column 121, 125, measured between inner and outer lateral faces of the vertical column, is less than 80 mm. More specifically, in this embodiment, the width W of each vertical column 121, 125 is approximately 60 mm (i.e., +/−5 mm). Given the relatively small width of each vertical column 121, 125, additional space may be afforded in the data center for storing racks 10, thus maximizing the use of floor space within the data center.

As can be seen, each of the left and right vertical columns 121, 125 also has front and rear bottom support brackets 240 that extend from the front end and the rear end of the corresponding formed panel 235 respectively. A fixing plate 252 is connected to each bottom support bracket 240 for affixing the corresponding vertical column 121, 125 to the support surface.

Figure 10:
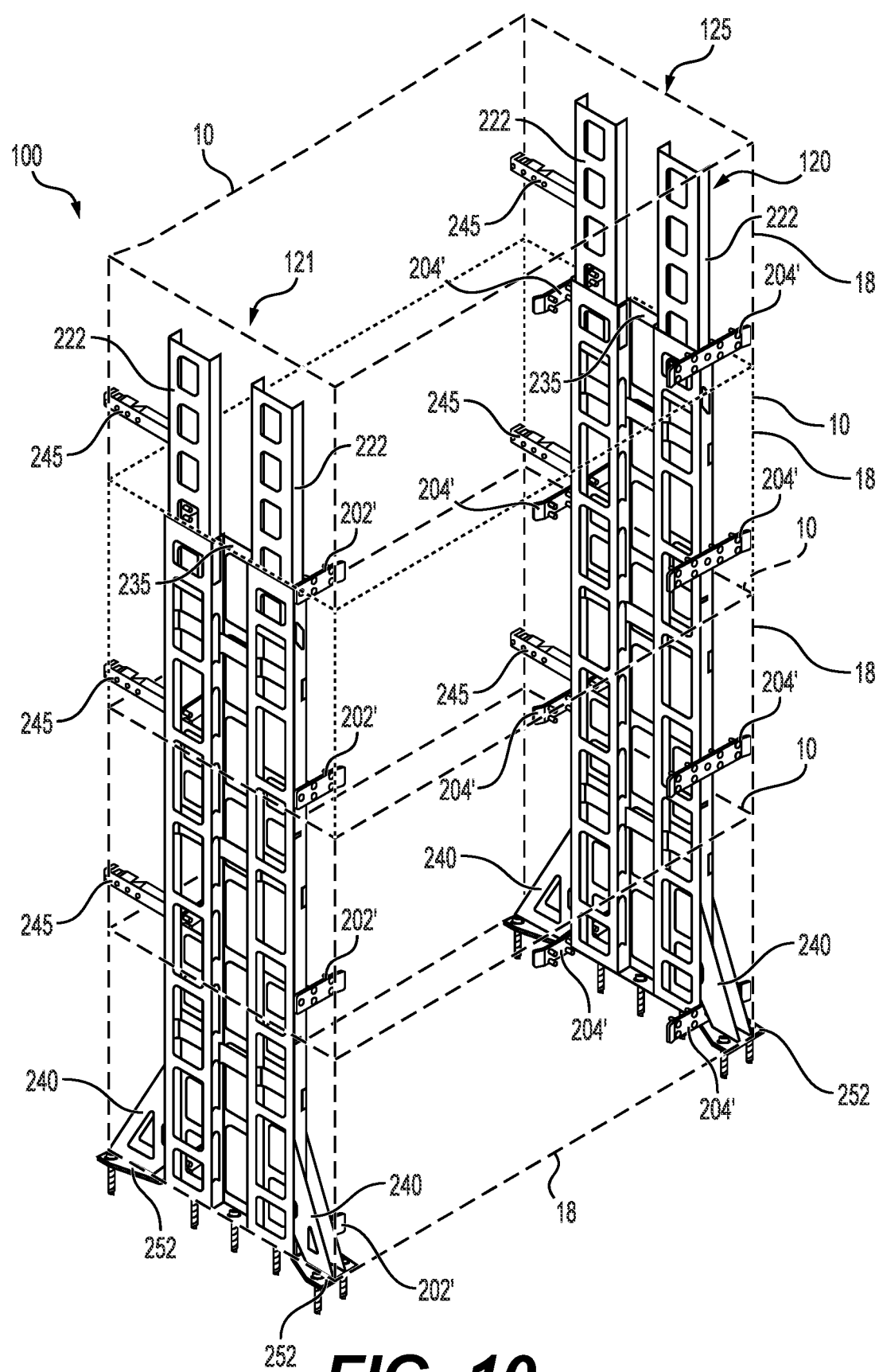
FIG. 10 is a perspective view, taken from a front, top, left side, of a rack column assembly according to an alternative embodiment.
Figure 11:
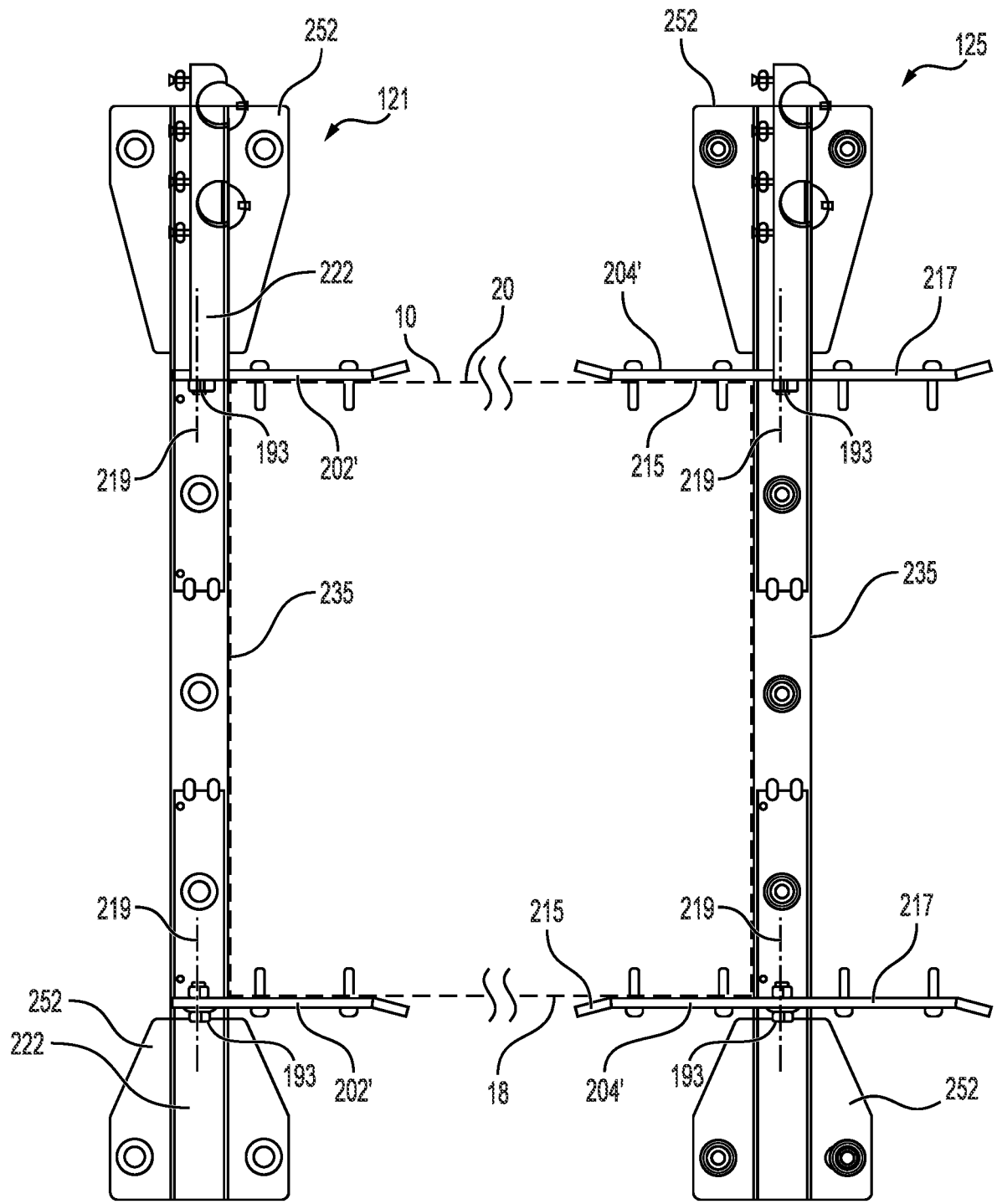
FIG. 11 is a top plan view of the rack column assembly of FIG. 10.

As shown in FIGS. 10 and 11, in this example, holding brackets 245 extend from the rear end of the formed panel 245. The holding brackets 245 are configured to hold liquid conduits 251, 253 that route cold and hot fluid to and from the electronic equipment stored in the racks 10 for cooling thereof (e.g., via liquid cooling blocks and/or heat exchangers).

Furthermore, with continued reference to FIGS. 10 to 13, in this alternative embodiment, left and right attachment brackets 202', 204' are provided to connect the racks 10 to the left and right vertical columns 121, 125. The left and right attachment brackets 202', 204' are configured similarly to the attachment brackets 202 described above and connected to the racks 10 in the same manner (namely via fasteners 191), therefore only the differences between the attachment brackets 202', 204' and the attachment brackets 202 will be described herein. In contrast with the attachment brackets 202, the attachment brackets 202', 204' are pivotally connected to the left and right vertical columns 121, 125. More specifically, each attachment bracket 202', 204' is pivotally connected to a front end (for the front ones of the attachment brackets 202', 204') of the corresponding formed panel 235 or a rear end (for the rear ones of the attachment brackets 202', 204') of the corresponding formed panel 235. As such, as shown in FIG. 11, each of the attachment brackets 202', 204' is pivotable about a respective pivot axis 219 extending in the depth direction of the rack column assembly 100. In particular, in this example, each pivot axis 219 is defined by a single fastener 193 that pivotally connects the corresponding attachment bracket 202', 204 to the front end or rear end of the formed panel 235. The pivotal connection of the brackets 202', 204' to the left and right vertical columns 121, 125 may facilitate the absorption of forces caused by seismic activity. In other embodiments, the brackets 202', 204' may not be pivotally connected and may instead be fixed.

It is contemplated that, in some embodiments, the attachment brackets 202 described above could be pivotally connected to the left and right vertical columns 121, 125 in the same manner as the attachment brackets 202', 204'.

Furthermore, with reference to FIGS. 10 and 11, in this embodiment, the right attachment brackets 204' have both an inwardly-extending portion 215 and an outwardly-extending portion 217. The inwardly-extending portion 215 extends towards the left vertical column 121 and is connected to the data center racks 10 of the rack column assembly via the fasteners 191. The outwardly-extending portion 217 extends in an opposite direction from the inwardly-extending portion 215 and is configured to be connected to the data center racks of another rack column assembly (similar to the rack column assembly 100) that is adjacent to the rack column assembly 100. In other words, a single one of the attachment brackets 204' could be connected to two data center racks 10 of adjacent rack column assemblies 100. The outwardly-extending portion 217 thus defines openings for inserting fasteners 191 that connect the outwardly-extending portion 217 to the data center rack 10 of the adjacent rack column assembly 100. In the illustrated embodiment, the left vertical column 121 is at an end of a row of rack column assemblies such that there are no adjacent rack column assemblies on the left side of the vertical column 121. For this reason, in this embodiment, the left attachment brackets 202' only have an inwardly-extending portion that extends toward the right vertical column 125. It is nevertheless contemplated that, in some embodiments, both the left and right attachment brackets 202', 204' could have the inwardly and outwardly-extending portions 215, 217.

In this embodiment, two extenders 222 are connected to the formed panel 235 to accommodate the fourth rack 10.

The rack column assembly 100 as shown in FIGS. 10 to 13 is significantly rigid in the height direction to limit the effect of seismic activity on the data center racks 10. By contrast, the vertical columns 121, 125 are allowed to bend in the lateral direction to absorb forces acting on the vertical columns 121, 125 due to seismic activity. In addition, the data center racks 10 may be horizontally displaced relative to each other, thereby exerting friction forces between the left and right vertical columns 121, 125 and which also help to absorb some of the forces caused by seismic activity.

It should be expressly understood that not all technical effects mentioned herein need to be enjoyed in each and every embodiment of the present technology.

The rack column assembly implemented in accordance with some non-limiting embodiment of the present technology can be represented as follows, presented in numbered clauses.

CLAUSE 1. A rack column assembly for a data center comprising: a first data center rack (10) positioned on a support surface (500); a second data center rack (10) stacked atop the first data center rack such that the first data center rack supports the second data center rack, the first and second data center racks having respective front sides, the first and second data center racks being configured to receive electronic equipment for storage therein via the front sides; and a retaining system (120) configured to prevent relative movement of the first and second data center racks of the rack column assembly, the retaining system comprising: a left vertical column (121) positioned on a left side of the first and second data center racks, the left vertical column being abutted against respective left ends (14) of the first and second data center racks; a right vertical column (125) positioned on a right side of the first and second data center racks, the right vertical column being abutted against respective right ends (16) of the first and second data center racks; a plurality of left attachment brackets (202) connecting the left vertical column to the first and second data center racks, the plurality of left attachment brackets including front left and rear left attachment brackets connected to the left vertical column and extending toward the right vertical column, the front left attachment brackets being spaced from the rear left attachment brackets in a depth direction of the rack column assembly, each of the first and second data center racks being fastened to a corresponding one of the front left attachment brackets and to a corresponding one of the rear left attachment brackets; and a plurality of right attachment brackets (202) connecting the right vertical column to the first and second data center racks, the plurality of right attachment brackets including front right and rear right attachment brackets connected to the right vertical column and extending toward the left vertical column, the front right attachment brackets being spaced from the rear right attachment brackets in a depth direction of the rack column assembly, each of the first and second data center racks being fastened to a corresponding one of the front right attachment brackets and to a corresponding one of the rear right attachment brackets.

CLAUSE 2. The rack column assembly of clause 1, wherein the left vertical column and the right vertical column are connected to the support surface.

CLAUSE 3. The rack column assembly of clause 1 or 2, wherein the first data center rack comprises guiding means on an upper surface (57) thereof configured to guide a position of the second data center rack relative to the first data center rack along the depth direction of the rack column assembly.

CLAUSE 4. The rack column assembly of any one of clauses 1 to 3, wherein: the rack column assembly comprises a third data center rack (10) stacked atop the second data center rack such that the second data center rack supports the third data center rack; the left vertical column is positioned on a left side of the third data center rack, the left vertical column being abutted against a left end (14) of the third data center rack; the right vertical column is positioned on a right side of the third data center rack, the right vertical column being abutted against a right end (16) of the third data center rack; and the third data center rack is fastened to one of the front left attachment brackets, to one of the rear left attachment brackets, to one of the front right attachment brackets, and to one of the rear right attachment brackets.

CLAUSE 5. The rack column assembly of any one of clauses 1 to 4, wherein: each of the left and right vertical columns comprises a formed panel (235) extending along at least a majority of a depth of the respective one of the left and right vertical columns; the front left and front right attachment brackets are connected to a front end of the formed panel; and the rear left and rear right attachment brackets are connected to a rear end of the formed panel.

CLAUSE 6. The rack column assembly of clause 5, wherein the formed panel is a single piece of sheet metal bent into shape.

CLAUSE 7. The rack column assembly of clause 5 or 6, wherein a cross-sectional profile of the formed panel (235) taken along a horizontal plane has a step-function shape including: three longitudinal parts corresponding to two coplanar walls (240, 244) of the formed panel and a central wall (242) disposed therebetween; and two lateral parts corresponding to two inner side walls (248) linking the coplanar walls to the central wall.

CLAUSE 8. The rack column assembly of clause 7, wherein: a middle channel (247) is defined between the central wall and the two inner side walls; a front channel (243) defined between a front one of the two coplanar walls, a front one of the two inner side walls, and a front one of two outer side walls (255) of the formed panel, the two outer side walls extending from respective ones of the two coplanar walls and being parallel to the two inner side walls; and a rear channel (249) defined between a rear one of the two coplanar walls, a rear one of the two inner side walls, and a rear one of the two outer side walls (255).

CLAUSE 9. The rack column assembly of any one of clauses 5 to 8, wherein a width of each one of the left and right vertical columns is less than 80 mm.

CLAUSE 10. The rack column assembly of clause 9, wherein the width of each one of the left and right vertical columns is approximately 60 mm.

CLAUSE 11. The rack column assembly of any one of clauses 1 to 10, wherein each of the left and right attachment brackets is pivotally connected to a corresponding one of the left vertical column and the right vertical column about a pivot axis extending in the depth direction of the rack column assembly.

CLAUSE 12. The rack column assembly of clause 11, wherein at least one of the left or right attachment brackets comprises: an inwardly-extending portion connected to a corresponding one of the first and second data center racks; and an outwardly-extending portion extending in an opposite direction from the inwardly-extending portion and configured to be connected to data center racks of a second rack column assembly adjacent to the rack column assembly.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A rack column assembly for a data center comprising:
    a first data center rack having a lower end positioned on a support surface;
    a second data center rack having an upper end defining an upper surface stacked atop the first data center rack such that the lower end of the second data center rack is resting on the upper surface of the first data center rack and such that the first data center rack supports the second data center rack,
    the first and second data center racks having respective front sides, the first and second data center racks being configured to receive electronic equipment for storage therein via the front sides; and
    a retaining system configured to prevent relative movement of the first and second data center racks of the rack column assembly, the retaining system comprising:
        a left vertical column positioned on a left side of the first and second data center racks, the left vertical column being abutted against respective left ends of the first and second data center racks;
        a right vertical column positioned on a right side of the first and second data center racks, the right vertical column being abutted against respective right ends of the first and second data center racks;
        a plurality of left attachment brackets connecting the left vertical column to the first and second data center racks, the plurality of left attachment brackets including front left and rear left attachment brackets connected to the left vertical column and extending toward the right vertical column,
        the front left attachment brackets being spaced from the rear left attachment brackets in a depth direction of the rack column assembly,
        each of the first and second data center racks being fastened to a corresponding one of the front left attachment brackets and to a corresponding one of the rear left attachment brackets;
        a plurality of right attachment brackets connecting the right vertical column to the first and second data center racks, the plurality of right attachment brackets including front right and rear right attachment brackets connected to the right vertical column and extending toward the left vertical column,
        the front right attachment brackets being spaced from the rear right attachment brackets in a depth direction of the rack column assembly,
        each of the first and second data center racks being fastened to a corresponding one of the front right attachment brackets and to a corresponding one of the rear right attachment brackets; and each of the left and right vertical columns comprising a formed panel extending along at least a majority of a depth of the respective one of the left and right vertical columns, the front left and front right attachment brackets being connected to a front end of the formed panel and the rear left and rear right attachment brackets being connected to a rear end of the formed panel, wherein a cross-sectional profile of the formed panel taken along a horizontal plane has a step-function shape including:

three longitudinal parts corresponding to two coplanar walls of the formed panel and a central wall disposed therebetween; and two lateral parts corresponding to two inner side walls linking the coplanar walls to the central wall.

2. The rack column assembly of claim 1, wherein:

the rack column assembly comprises a third data center rack stacked atop the second data center rack such that the second data center rack supports the third data center rack;

the left vertical column is positioned on a left side of the third data center rack, the left vertical column being abutted against a left end of the third data center rack;

the right vertical column is positioned on a right side of the third data center rack, the right vertical column being abutted against a right end of the third data center rack; and the third data center rack is fastened to one of the front left attachment brackets, to one of the rear left attachment brackets, to one of the front right attachment brackets, and to one of the rear right attachment brackets.

3. The rack column assembly of claim 1, wherein the formed panel is a single piece of sheet metal bent into shape.

4. The rack column assembly of claim 1, wherein:

a middle channel is defined between the central wall and the two inner side walls;

a front channel defined between a front one of the two coplanar walls, a front one of the two inner side walls, and a front one of two outer side walls of the formed panel, the two outer side walls extending from respective ones of the two coplanar walls and being parallel to the two inner side walls; and a rear channel defined between a rear one of the two coplanar walls, a rear one of the two inner side walls, and a rear one of the two outer side walls.

\* \* \* \* \*